US008703385B2

(12) United States Patent
Qiu et al.

(10) Patent No.: US 8,703,385 B2
(45) Date of Patent: Apr. 22, 2014

(54) PHOTORESIST COMPOSITION

(75) Inventors: Zai-Ming Qiu, Woodbury, MN (US); Douglas C. Fall, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 98 days.

(21) Appl. No.: 13/370,767

(22) Filed: Feb. 10, 2012

(65) Prior Publication Data

US 2013/0209921 A1 Aug. 15, 2013

(51) Int. Cl.
G03C 1/00 (2006.01)
G03F 7/00 (2006.01)

(52) U.S. Cl.
USPC .................................. 430/270.1; 428/412

(58) Field of Classification Search
USPC .............. 430/270.1; 101/128.21; 428/412
See application file for complete search history.

(56) References Cited

U.S. PATENT DOCUMENTS

| | | | |
|---|---|---|---|
| 2,716,102 A | 8/1955 | Unruh | |
| 2,940,853 A | 6/1960 | Sagura | |
| 3,046,110 A | 7/1962 | Schmidt | |
| 3,046,112 A | 7/1962 | Schmidt | |
| 3,046,119 A | 7/1962 | Sus | |
| 3,046,121 A | 7/1962 | Schmidt | |
| 3,106,465 A | 10/1963 | Neugebauer | |
| 3,149,975 A | 9/1964 | Notley | |
| 3,869,292 A | 3/1975 | Peters | |
| 4,148,655 A | 4/1979 | Itoh | |
| 4,180,404 A | 12/1979 | Ohmura | |
| 4,262,072 A | 4/1981 | Wendling | |
| 4,377,631 A | 3/1983 | Toukhy | |
| 4,477,529 A * | 10/1984 | Campbell | 428/412 |
| 4,514,315 A | 4/1985 | Matulewicz | |
| 4,588,670 A | 5/1986 | Kelly | |
| 4,596,763 A | 6/1986 | DiCarlo | |
| 4,888,269 A | 12/1989 | Sato | |
| 4,902,726 A | 2/1990 | Hayashi | |
| 5,009,982 A | 4/1991 | Kamayachi | |
| 5,055,378 A | 10/1991 | Miyamura | |
| 5,061,744 A | 10/1991 | Ogitani | |
| 5,268,256 A | 12/1993 | Goetz | |
| 5,629,133 A | 5/1997 | Wolf | |
| 5,753,722 A | 5/1998 | Itokawa | |
| 5,770,347 A * | 6/1998 | Saitoh et al. | 430/280.1 |
| 5,948,514 A | 9/1999 | Komori | |
| 6,617,365 B2 * | 9/2003 | Burkhart et al. | 521/112 |
| 7,601,228 B2 | 10/2009 | Nishina | |
| 2007/0003866 A1 | 1/2007 | Takamuki | |
| 2007/0128546 A1 | 6/2007 | Saraiya | |
| 2010/0048751 A1 | 2/2010 | Keary | |
| 2010/0048757 A1 | 2/2010 | Okada | |
| 2010/0247873 A1 | 9/2010 | Yokoi | |
| 2011/0008733 A1 * | 1/2011 | Qiu et al. | 430/272.1 |
| 2011/0027702 A1 | 2/2011 | Qiu | |

FOREIGN PATENT DOCUMENTS

EP 0 232 972 9/1993
WO WO 2009/114580 9/2009

OTHER PUBLICATIONS

Turner, et al., "The Chemistry of Photoresists," Photopolymerisation and Photoimaging Science and Technology, Chapter 3, Jan. 1, 1989, pp. 75-113.
DeForest, "Types of Photoresists," Photoresist: Materials and Processes, Chapter 2, pp. 19-62, McGraw-Hill Book Company, New York, 1975.
Moreau, "Positive Photoresists," Semiconductor Lithography: Principles, Practices and Materials, Chapter 2, pp. 29-79, Plenum Press, New York, 1988.
Moreau, "Positive Photoresists," Semiconductor Lithography: Principles, Practices and Materials, Chapter 4, pp. 157-210, Plenum Press, New York, 1988.
PCT International Search Report, PCT/US2013/024737, 4 pages.

* cited by examiner

Primary Examiner — Stewart Fraser
(74) Attorney, Agent, or Firm — Kent S. Kokko

(57) ABSTRACT

A low surface energy photoresist composition is described that comprises a silicone-polyether block copolymer, wherein the silicone block comprises 35 wt. % or more of said copolymer. When compounded with a photoresist composition, the composition enables the release of a phototool from the photoresist layer.

11 Claims, No Drawings

PHOTORESIST COMPOSITION

BACKGROUND

In the printed circuit industry, photographic masks or stencils bearing a circuit pattern are known as phototools. Such a stencil, through which a photoresist can be exposed, provides an intricate complex image representing an electrical circuit. The image often consists of many fine lines and junctions spaced closely together. During its use to make printed circuit boards, the phototool is placed face down on a photoresist layer and a contact print is made by exposing the photoresist to light, typically UV light, through the phototool, followed by separation of the phototool from the exposed photoresist layer. In this way, a single phototool can be used to make multiple contact prints.

The continued use of the phototool can cause tiny scratches and abrasions on the phototool surface. The photoresists on which the phototool is placed are usually laminated on sheet copper (or other vapor-deposited copper substrates) and small burrs or rough edges of the copper sheet can cause scratches as the phototool is transferred from one photoresist to the next. The phototool is also frequently wiped with a soft cloth to make sure it is dust and lint free. Small particles of dirt can cause scratching as they are wiped across the phototool surface. Because of this general wear and tear on the phototool surfaced during normal use, the phototool must be frequently inspected to ensure line continuity. Depending upon the size and the intricacy of the phototool, such microscopic inspections can take 2 to 3 hours.

Ideally, the phototool must be cleanly removable from the exposed photoresist to minimize contamination of the phototool. Various means of protecting the phototool have been described.

Due to the fact that phototools are vulnerable to scratching and that abrasion is a serious problem during the normal use of a phototool, protective films and overcoats having release performance are often employed to protect the phototool and allow repeated use of the phototool. For example, polysiloxane films coated with various kinds of pressure sensitive adhesives have been laminated to image-bearing surfaces to protect the image and provide smooth release. Because of their thickness, however the laminating films can cause optical distortion. In addition, the polysiloxane films are relatively soft and thus provide only limited scratch protection.

Thinner and harder protective coatings can be obtained by coating the surfaces of phototools with liquid compositions. Then, the thin liquid coating is hardened to yield the desired protective coat with improved scratch resistance. Epoxy silanes and acrylate esters (for example, polyurethane acrylates) have been used as protective hard coatings because of their resistance to abrasion. Many of these protective overcoats have limited release properties, however, and can therefore stick to the surface of the photoresist even when additional slipping agents are used, particularly when sticky photoresist materials such as high viscosity solder mask inks are present.

WO 2009/114580 (Qiu et al.) describe a hardcoat composition to be applied to the phototool with reduced surface energy for improved durable release from photoresist that comprises (a) one or more epoxy silane compounds, (b) one or more epoxy-functionalized perfluoropolyether acrylate oligomers, and (c) photoacid generator. US 2013/059286 (Qiu), describes hardcoat compositions comprising (a) an epoxy silane compound, (b) a reactive silicone additive, and (c) photo-acid generator for phototool protection and release performance.

An alternative approach for easier release of a phototool from a photoresist, and for repeated use of the phototool, is having a low surface energy photoresist, which can be achieved by using a low surface energy additive in the photoresist.

SUMMARY

In view of the foregoing, we recognize that there is a need for photoresist compositions that can be cured by exposure to actinic radiation, and that release easily from the phototool even when sticky materials such as high viscosity solder masks are present.

The present disclosure provides a low surface energy photoresist composition that comprises a silicone-polyether block copolymer, wherein the silicone block comprises 35 wt. % or more of said copolymer. When compounded with a photoresist composition, the composition enable the manufacture of circuits by affixing a phototool on a photoresist layer, exposing the photoresist layer with the phototool to high intensity light, easily removing the phototool from the photoresist layer comprising the silicone-polyether block copolymer, and developing the light exposed photoresist under normal conditions for final product, such as printed circuit broad.

DETAILED DESCRIPTION

The photoresist composition comprises a silicone-polyether block copolymer, in which the polyether block(s) may be pendent from the siloxane polymer chain, or may be at one or both terminal ends. The copolymer has the general structures $A^{SIL}_a\text{-}B^{PE}_b$, or $B^{PE}_b\text{-}A^{SIL}_a\text{-}B^{PE}_b$, wherein $A^{SIL}$ represents a silicone block, $B^{PE}$ represents a polyether block, a and b are weight percents of each block. Subscript "a" is chosen such that the silicone block comprises at least 35 wt. % of the copolymer, and is generally in the range of 35 to 90 wt. % of the block copolymer.

It has been found that the resist composition having below 35 wt. % of silicone segment in silicone-polyether block copolymer additive, release of the phototool is limited or poor. The same has been observed when pure reactive silicone without a polyether block, such as silanol terminated silicones, reactive silicone having silicone block of 90 wt. % or more, such as epoxy terminated silicones. Preferably the silicone-polyether block copolymer comprises an average molecular weight range, $M_w$, of 200 to 15,000, preferably 500 to 5000.

The photocurable composition comprises 0.1 to 5 parts by weight of the silicone-polyether block copolymer relative to 100 parts by weight of the photoresist component.

The silicone-polyether block copolymer may be of the formula:

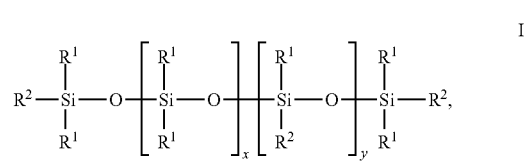

wherein
each $R^1$ is independently selected from alkyl and aryl groups,
each $R^2$ is independently selected from alkyl, aryl and polyether block,
x is 3 to 100, y is 0 to 20, with the proviso that at least one $R^2$ group is polyether block.

It will be apparent that the copolymers of formula I include those block copolymer having polyether blocks on one or both termini of the silicone block chain, or pendent from the chain, or both.

In embodiments having polyether blocks pendent from the silicone block, the copolymer is of the formula

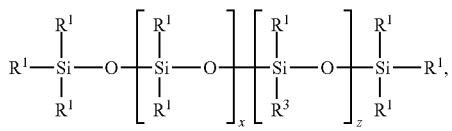

wherein
each $R^1$ is independently selected from alkyl and aryl,
$R^3$ is a polyether block,
x is 3 to 100,
z is 1 to 20.

In embodiments having polyether blocks on a terminus of the silicone block, the copolymer is of the formula

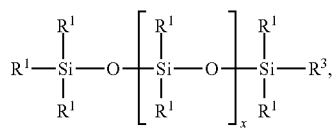

wherein
each $R^1$ is independently selected from alkyl and aryl,
$R^3$ is polyether block,
x is 3 to 100.

With retard to Formulas I, II and III, polyether block is of the formula:

$$—Q—(C_nH_{2n}O)_w—R^5, \quad IV$$

wherein
n is 2 to 4,
w is 2 to 50,
$R^5$ is H, alkyl, or aryl, and
Q is a divalent linking group selected from —O—, —$NR^6$—, —$C_mH_{2m}O$—, and —$C_mCH_{2m}(OH)C_2H_4X$—, where $R^6$ is H, alkyl, or aryl, and each m is independently 1 to 4, and X is —O—, —S— or —$NR^6$.

The alkylene portion of the polyether blocks may be linear or branched and preferably include polyethyleneoxy (PEO), poly(n-propyleneoxy) (PPO), poly(i-propyleneoxy), poly(n-butaleneoxy) and combined polyethyleneoxy/polypropyleneoxy(PEO/PPO). It will be understood that such PEO/PPO blocks may have an average non-integral value of "w" between 2 and 3.

The compounds may be prepared as described in the literature for silicone-polyether copolymers, e.g. by hydrosilylation of a double-bond-containing polyether, if desired in admixture with other double-bond-containing polyethers if mixtures of various stabilizers according to the invention are to be obtained. Another possible way of preparing the corresponding Si—O—C-linked structures is equilibration catalyzed by iron(III) chloride as is known from the literature, e.g. of chlorotrimethylsilane with cyclic polydimethylsiloxanes. Subsequent reaction of the resulting Si—Cl-functionalized polydimethylsiloxanes with hydroxyl- or amine-containing polyoxyalkylene copolymers under basic conditions and subsequent filtration of the amine salts formed and, if appropriate, removal of solvent used by distillation gives the desired block copolymers.

With reference to Formula IV, the Q groups of the formula -, —$C_mH_{2m}O$— are derived from a hydrosilylation reaction. Q groups of the formula —O—, and —$NR^6$— and derived from a condensation reaction of a silyl halide with a hydroxyl- or amine-terminated poly(alkylene oxide) compound. Q groups of the formula —$C_mH_{2m}(OH)C_2H_4X$—, where X is —O—, —S— or —$NR^6$—, are derived from the reaction of an epoxy silane with a hydroxyl- or amine-terminated poly(alkylene oxide).

Reference may be made to U.S. Pat. No. 6,617,365 (Burkhart et al., incorporated herein by reference. U.S. Pat. No. 4,514,315 discloses a procedure for grafting ethylenically unsaturated alkylene silanes onto polyalkylene oxide polymers, wherein the amount of silane monomer which was grafted onto the polyalkylene oxide polymer was up to 60 weight percent of the total product.

Commercially available silicone-polyether materials include those from Gelest Inc. (CMS-222™, CMS-832™, DBP-C22™, DBE-224™, DBP-534™), BYK Chemie (BYK-307™ and BYK-333™); Dow Corning (Dow Corning FF-400 Fluid™, Dow Corning Q4-3667 Fluid™, Dow Corning Q2-5097 Fluid™, Dow Corning 2-8692 Fluid™, Dow Corning 1248 Fluid™), GE Silicones (Silwet L-7550™, Silwet L-7200™, CoatOSil 3501™, CoatOSil 3500™, CoatO-Sil 3503™, CoatOSil 7510™, CoatOSil 7650™, and CoatO-Sil 3505™) hut are not limited to these commercially available materials.

Photoresist compositions are well known in the art of semiconductor lithography and are described in numerous publications including DeForest, Photoresist Materials and Processes, McGraw-Hill Book Company, New York, Chapter 2, 1975 and Moreau, Semiconductor Lithography, Principles, Practices and Materials, Plenum Press, New York, Chapters 2 and 4, 1988, incorporated herein by reference.

Useful photoresists can also include positive photoresists that include a polymer that becomes soluble in a basic developer upon exposure to radiation and negative photoresists that cross-link and become insoluble upon exposure to radiation. A variety of photo-sensitive polymers may be used in photoresists. Examples include, but are not limited to, copolymers of methyl methacrylate, ethyl acrylate and acrylic acid, copolymers of styrene and maleic anhydride isobutyl ester, and the like. The thickness of the photoresist is typically from about 1 µm to about 50 µm. The photoresist is then exposed to ultraviolet light or the like, through a mask or phototool, crosslinking the exposed portions of the resist. The unexposed portions of the photoresist are then developed with an appropriate solvent until desired patterns are obtained. For a negative photoresist, the exposed portions are crosslinked and the unexposed portions of the photoresist are then developed with an appropriate solvent. All photoresists using phototool for generating patterns in lithographic process requires the release of phototool from photoresists.

Exemplary negative photoresists include UVN 30 (available from Rohm and Haas Electronic Materials), and FUTURREX negative photoresists, such as NR9-1000P and NR9-3000PY (available from Futurrex, Franklin, N.J.).

Suitable positive-working photoresists typically contain two components, i.e., a light-sensitive compound and a film-forming polymer. The light-sensitive compound undergoes photochemical alteration upon exposure to radiation. Single component systems which employ polymers that undergo chain scission upon exposure to radiation are known. Light-sensitive compounds typically employed in two-component photoresist systems are esters formed from o-quinone diazide sulfonic acids, especially sulfonic acid esters of naphthoquinone diazides. These esters are well known in the art and are described in DeForest, supra, pages 47-55, and in Moreau, supra, pages 34-52. Light-sensitive compounds and methods used to make such compounds are disclosed in U.S. Pat. Nos. 3,046,110, 3,046,112, 3,046,119, 3,046,121, 3,106,465, 4,596,763 and 4,588,670, all incorporated herein by reference. Exemplary positive photoresists include UV5 photoresist and Shipley 1813 photoresist (both available from Rohm and Hass Electronic Materials, Marlborough, Mass.).

Polymers most frequently employed in combination with positive-working photoresists, e.g., o-quinone diazides, are the alkali soluble phenol formaldehyde resins known as the novolak resins. Photoresist compositions containing such polymers are described in U.S. Pat. Nos. 4,377,631 and 4,404,272. As disclosed in U.S. Pat. No. 3,869,292, another class of polymers utilized in combination with light-sensitive compounds is homopolymers and copolymers of vinyl phenol. The process of the instant invention is especially useful for the purification of positive-working photoresist compositions, such as the vinyl phenol-containing photoresist compositions.

Negative-working resist compositions can also be purified in accordance with the invention and are well known in the art. Such photoresist compositions typically undergo random crosslinking upon exposure to radiation thereby forming areas of differential solubility. Such resists often comprise a polymer and a photoinitiator. One class of negative-working photoresists comprises, for example, polyvinyl cinnamates as disclosed by R. F. Kelly, Proc. Second Kodak Semin. Micro Miniaturization, Kodak Publication P-89, 1966, p. 31. Other negative-working photoresists include polyvinyl-cinnamate acetates as disclosed in U.S. Pat. No. 2,716,102, azide cyclized rubber as disclosed in U.S. Pat. No. 2,940,853, polymethylmethacrylate/tetraacrylate as disclosed in U.S. Pat. No. 3,149,975, polyimide-methyl methacrylate as disclosed in U.S. Pat. No. 4,180,404 and polyvinyl phenol azide as disclosed in U.S. Pat. No. 4,148,655.

Another class of photoresists for purposes of the invention are those positive and negative acid-hardening resists disclosed in EP Application No. 0 232 972. These photoresists comprise an acid-hardening polymer and a halogenated, organic, photoacid generating compound.

A special photoresist is a solder resist which is used as permanent protective coating for printed wiring boards. Since the requirements of solder resist as a permanent insulating for moisture resistance, electrochemical migration resistance, thermal shock resistance, heat resistance and chemical resistance in addition to good hardness, adhesion and long shelf life, the composition normally includes both thermosetting and photosetting components and correspondingly may need severe setting conditions which results as one of the stickiest photoresist for phototool to release. Solder resists include those disclosed in U.S. Pat. No. 4,888,269 (Sato et al.), U.S. Pat. No. 4,902,726 (Hayashi et al.), U.S. Pat. No. 5,009,982 (Kamayachi et al.), U.S. Pat. No. 5,055,378 (Miyamura et al.), U.S. Pat. No. 5,061,744 (Ogitani et al.), U.S. Pat. No. 5,753,722 (Itokawa et al.), U.S. Pat. No. 5,948,514 (Komori et al.), and U.S. Pat. No. 7,601,228 (Nishina et al.) each incorporated herein by reference. Of particular interest are those photocurable and thermosetting compositions disclosed in U.S. Pat. No. 5,770,347 (Saitoh et al.), U.S. Pat. No. 5,753,722 (Itokawa et al.) and U.S. Pat. No. 5,948,514 (Komori et al.), which may be compounded with silicone-polyether block copolymer to produce a photoresist that is cleanly and easily removed from the phototool after irradiation. Solder resists are commercial available, such as from Taiyo Ink Mfg. Co. Ltd.

If desired, the photocurable composition of the photoresist composition may further comprise a thermosetting resin, especially for solder masks to provide a tougher coating with better adhesion. The thermoset resin may comprise or more members selected from among amino resins, cyclocarbonate compounds, blocked isocyanates, and epoxy resins.

Useful amino resins include such methylated melamine resins as the products of Sanwa Chemicals Co., Ltd. marketed under trademark designations of NIKALAC MW-30, NIKALAC MW-30M, NIKALAC MW-22, NIKALAC MW-22A, NIKALAC MS-11, and NIKALAC MX-750 and the products of Mitsui-Cytec LTD. marketed under trademark designations of Cymel 300, Cymel 301, and Cymel 350; such mixed alkylated melamine resins as the products of Sanwa Chemicals Co., Ltd. marketed under trademark designations of NIKALAC MX-40 and NIKALAC MX-470 and the products of Mitsui-Cytec LTD. marketed under trademark designations of Cymel 238, Cymel 235, and Cymel 232; such imino group type melamine resins as the products of Mitsui-Cytec LTD. marketed under trademark designations of Cymel 325, Cymel 327, and Cymel XV-514; such benzoguanamine type amino resins as the products of Sanwa Chemicals Co., Ltd. marketed under trademark designations of NIKALAC BL-60 and NIKALAC BX-4000, such urea type amino resins as the products of Sanwa Chemicals Co., Ltd. marketed under trademark designations of NIKALAC MX-121 and NIKALAC MX-201; such melamine resins possessing an ethylenically unsaturated bond as the product of Sanwa Chemicals Co., Ltd. marketed under trademark designation of NIKALAC MX-302, and reaction products of these amino resins with N-methylol (meth)acrylamide, for example. In these amino resins, the average amount of formaldehyde bound to each of the active hydrogen atoms of the amino group ($—NH_2$) is properly not less than 65%, preferably not less than 80%. If this average amount is less than 65%, the developability of the composition will be unduly low because of the self-condensation of a given amino resin. The average degree of alkylation effected on a methylol group formed by the reaction of an amino group with formaldehyde is properly not less than 70%, preferably not less than 90%. If this average degree of alkylation is less than 70%, no good developability of the coating film will be attained because a curing reaction tends to proceed and a thermal fogging tends to occur during the step of drying. The amino resins which satisfy the requirements mentioned above, possess numerous points of crosslinking, and impart more perfect properties to the coating film include NIKALAC MW-30, NIKALAC MW-30M, NIKALAC MW-22, NIKALAC MW-22A, NIKALAC MX-40, NIKALAC MX-301, Cymel 300, Cymel 301, and the reaction products of melamine resins as with N-methylol (meth)acryl amide, for example.

The compounds which are obtained by the reaction of carbon dioxide gas upon epoxy resins are included among the aforementioned cyclocarbonate compounds. The epoxy resins mentioned above include such well-known epoxy compounds as glycidyl ethers of the bisphenol A type, hydrogenated bisphenol A type, bisphenol F type, bisphenol S type, phenol novolak type, cresol novolak type, bisphenol A-based novolak type, biphenol type, and bixylenol type; triglycidyl isocyanurate; and glycidyl amines such as N,N,N',N'-tetraglycidyl methaxylene diamine and N,N,N',N'-tetraglycidyl bisaminomethyl cyclohexane. Among other epoxy resins cited above, such powdery epoxy resins as bixylenol diglycidyl ether and triglycidyl isocyanurate prove to be desirable from the view points of developability and tack-free touch of finger of the coating film. The cyclocarbonate compounds which are produced from these epoxy resins may be used either singly or in the form of a mixture of two or more members.

The blocked isocyanates mentioned above include oxime blocked products (compounds whose isocyanate groups are blocked with oximes), caprolactam blocked products, and dimethyl amine blocked products of such well-known diisocyanates as tolylene diisocyanate, hexamethylene diisocyanate, isophorone diisocyanate, diphenylmethane diisocyanate, and naphthalene diisocyanate, for example. These blocked isocyanates can be used either singly or in the form of a mixture of two or more members.

As the epoxy resin to be used as a thermosetting component mentioned above, any of such well-known epoxy resins as the epoxy resins of the bisphenol A type, hydrogenated bisphenol A type, bisphenol F type, bisphenol S type, phenol novolak type, cresol novolak type, bisphenol A-based novolak type, biphenol type, and bixylenol type; alicyclic epoxy resins; diglycidyl ethers of polyethylene glycol or polypropylene glycol; and triglycidyl isocyanurate may be used. The epoxy resins may be used either singly or in the form of a mixture of two or more members. Among other epoxy resins cited above, such powdery epoxy resins as triglycidyl isocyanurate prove to be desirable from the view point of developability of the coating film. Further from the viewpoint of their reactivity, solubility, and life of dried coating film, the triglycidyl isocyanurate of the high-melting type having three epoxy groups thereof oriented in one direction relative to the plane of the S-triazine skeleton proves to be particularly preferable among other species of triglycidyl isocyanurate.

The amount of the thermosetting component to be incorporated in the composition is desired to be in the range of from 5 to 40 parts by weight, preferably 10 to 30 parts by weight, based on 100 parts by weight of the photoresist. If the amount of the thermosetting component is less than 5 parts by weight based on 100 parts by weight of the photocurable resin, the characteristic properties such as adhesiveness to the substrate, resistance to soldering temperature, and resistance to chemicals which the cured coating film is expected to manifest will not be easily obtained. Conversely, if this amount exceeds 40 parts by weight, the thermosetting component except for the high-melting epoxy resin will suffer the disadvantage of incurring difficulty in obtaining a tack-free coating film.

The photoresist composition may optionally include a diluents such as water or an organic solvent. Examples of organic solvents include alcohols, e.g., methanol, ethanol, isopropanol, etc.; esters, e.g., ethyl acetate, ethyl lactate, etc.; cyclic ethers, e.g., tetrahydrofuran, dioxane, etc.; ketones, e.g., acetone, methyl ethyl ketone, etc.; alkylene glycol ethers or esters, e.g., ethylene glycol ethyl ether, ethylene glycol ethyl ether acetate, ethylene glycol dimethyl ether, diethylene glycol dimethyl ether, propylene glycol monomethyl ether acetate, etc.; cellosolves, carbitols, cellosolve acetates, carbitol acetates, and aromatic hydrocarbons. Among other organic solvents mentioned above, water-soluble organic solvents prove to be particularly desirable. The amount of the organic solvent to be used is desired to be not more than 50 parts by weight, preferably not more than 30 parts by weight, based on 100 parts by weight of the photoresist described above. Normally the solvent is removed by the application of heat after coating.

The photoresist compositions of the instant disclosure may optionally incorporate therein additionally a photopolymerizable monomer. The photopolymerizable monomers which are usable herein include hydroxyl group-containing acrylates such as 2-hydroxyethyl acrylate, 2-hydroxybutyl acrylate, pentaerythritol triacrylate, and dipentaerythritol pentaacrylate; acrylamide derivatives such as acrylamide and N-methylolacrylamide; water-soluble acrylates such as polyethylene glycol diacrylate and polypropylene glycol diacrylate; acrylates such as trimethylolpropane triacrylate and pentaerythritol tetraacrylate; and methacrylates corresponding to the acrylates mentioned above, for example. These photopolymerizable monomers may be used either singly or in the form of a combination of two or more members. Among other photopolymerizable monomers mentioned above, the hydrophilic group-containing (meth)acrylates prove to be particularly desirable in terms of liquid stability of the composition and the polyfunctional (meth)acrylates prove to be particularly desirable in terms of the photocuring properties. Further, such macromolecular compounds as polyvinyl alcohol, polyacrylamide, carboxymethyl cellulose, polyvinyl formal resin, and polyvinyl acetal resin which are water-soluble resins may be used as a protective colloid. The use of the protective colloid is effective in improving the liquid stability of the composition. Likewise for the purpose of improving the liquid stability of the composition, a surface-active agent may be used. From the viewpoints of electrical insulation properties, resistance to electrolytic corrosion, and liquid stability, the surface-active agent is desired to be of a nonionic type having an HLB (hydrophilic-lipophilic balance) value of not less than 13.

Optionally, such well-known and widely used inorganic fillers as barium sulfate, talc, silica, aluminum oxide, and aluminum hydroxide may be used for the purpose of enhancing the characteristic properties of the composition of the present invention such as adhesiveness to a substrate, hardness, and resistance to soldering temperature of the cured coating film. The amount of the inorganic filler to be used is desired to be in the range of not more than 100 parts by weight, preferably 5 to 50 parts by weight, based on 100 parts by weight of the photoresist composition. Further, well-known and widely used additives such as color pigments, thermopolymerization inhibitors, curing catalysts, thickening agents, anti-foaming agents, leveling agents, and coupling agents may be used, as occasion demands.

PIs

Polymerization or curing of the composition can be accomplished by exposing the composition to energy in the presence of a photoinitiator. These photoinitiators can be employed in concentrations ranging from about 0.0001 to about 3.0 pbw, preferably from about 0.001 to about 1.0 pbw, and more preferably from about 0.005 to about 0.5 pbw, per 100 pbw of the photoresist component (or is it the photoresist plus the additive?)

Useful photoinitiators include those known as useful for photocuring free-radically monomers. Exemplary photoinitiators include benzoin and its derivatives such as alpha-methylbenzoin; alpha-phenylbenzoin; alpha-allylbenzoin; alpha-benzylbenzoin; benzoin ethers such as benzil dimethyl ketal (e.g., "IRGACURE 651" from BASF, Florham Park, N.J.), benzoin methyl ether, benzoin ethyl ether, benzoin n-butyl ether; acetophenone and its derivatives such as 2-hydroxy-2-methyl-1-phenyl-1-propanone (e.g., "DAROCUR 1173" from BASF, Florham Park, N.J.) and 1-hydroxycyclohexyl phenyl ketone (e.g., "IRGACURE 184" from BASF, Florham Park, N.J.); 2-methyl-1-[4-(methylthio)phenyl]-2-(4-morpholinyl)-1-propanone (e.g., "IRGACURE 907" from BASF, Florham Park, N.J.); 2-benzyl-2-(dimethylamino)-1-[4-(4-morpholinyl)phenyl]-1-butanone (e.g., "IRGACURE 369" from BASF, Florham Park, N.J.) and phosphine oxide derivatives such as Ethyl-2,4,6-trimethylbenzoylphenylphoshinate (e.g. "TPO-L" from BASF, Florham Park, N.J.), and Irgacure 819 (phenylbis(2,4,6-trimethylbenzoyl) phosphine oxide) available from BASF, Florham Park, N.J.

Other useful photoinitiators include, for example, pivaloin ethyl ether, anisoin ethyl ether, anthraquinones (e.g., anthraquinone, 2-ethylanthraquinone, 1-chloroanthraquinone, 1,4-dimethylanthraquinone, 1-methoxyanthraquinone, or benzanthraquinone), halomethyltriazines, benzophenone and its derivatives, iodonium salts and sulfonium salts, titanium complexes such as bis(eta$_5$-2,4-cyclopentadien-1-yl)-bis[2,6-difluoro-3-(1H-pyrrol-1-yl)phenyl] titanium (e.g., "CGI 784DC" from BASF, Florham Park, N.J.); halomethyl-nitrobenzenes (e.g., 4-bromomethylnitrobenzene), mono- and bis-acylphosphines (e.g., "IRGACURE 1700", "IRGACURE 1800", "IRGACURE 1850", and "DAROCUR 4265").

The photocurable composition may be irradiated with activating UV or visible radiation to polymerize the components preferably in the wavelengths of 250 to 500 nanometers. UV light sources can be of two types: 1) relatively low light intensity sources such as blacklights that provide generally 10 mW/cm$^2$ or less (as measured in accordance with procedures approved by the United States National Institute of Standards and Technology as, for example, with a UVIMAP™ UM 365 L-S radiometer manufactured by Electronic Instrumentation & Technology, Inc., in Sterling, Va.) over a wavelength range of 280 to 400 nanometers and 2) relatively high light intensity sources such as medium- and high-pressure mercury arc lamps, electrodeless mercury lamps, light emitting diodes, mercury-xenon lamps, lasers, LED UV light sources, and the like, which provide intensities generally between 10 and 5000 mW/cm$^2$ in the wavelength rages of 320-390 nm (as measured in accordance with procedures approved by the United States National Institute of Standards and Technology as, for example, with a PowerPuck™ radiometer manufactured by Electronic Instrumentation & Technology, Inc., in Sterling, Va.).

The photocurable composition is often cured using a phototool to cure only selective portions of the photocurable composition. Phototools are typically made using a computer-aided design (CAD) system to prepare data for an exposure apparatus (for example, a photo-plotter) based on a target blueprint or data. Then, this data is used to perform direct writing of a designed pattern (for example, a circuit pattern) onto an emulsion photographic dry plate, which has been prepared by forming a film surface of a photosensitive emulsion layer on an optically clear substrate (for example, a glass substrate, fused silica or polyethylene terephthalate (PET), polycarbonate, or polymethylmethacrylate substrate). Optically clear substrates typically have low haze (for example, less than about 5% or even less than about 2%) and are substantially transparent (that is, they typically allow the passage of 95% or more (preferably 98% or more) of visible and ultraviolet light.

The photographic dry plate with the pattern thereon is then developed, fixed, washed in water, and dried. It may then be examined for defects and, if necessary, retouched. The photosensitive emulsion layer typically comprises a silver halide emulsion or a diazo emulsion. Thus, the film surface is relatively soft and easily scratched or marked, correspondingly, special care is needed to prevent any scratching. Chrome metal absorbing film may also be used.

If desired, the phototool may further comprise a release coating to further improve the release properties from photoresist comprising both cured and uncured parts to avoid or reduce any possible damage and reduce contamination, in addition to a durable protective hard coating to improve scratch and abrasion resistance. Thus the phototool may further comprise a coating such as that described in U.S. 2010/048751 (Qiu, incorporated by reference) comprising an epoxy silane and an oligomer of the formula $M^F M^E M^S$, where $M^F$ is a fluorinated (meth)acrylate, $M^E$ comprises an epoxy (meth)acrylate and $M^S$ comprises a silane (meth)acrylate. Alternatively the phototool can comprise a such as that described in US2010/048757 (Qiu, incorporated by reference) comprising an epoxy silane and an oligomer of the formula $M^F M^E M^A$, m where $M^F$ is a fluorinated (meth)acrylate, $M^E$ comprises an epoxy (meth)acrylate and $M^A$ comprises a (meth)acrylate. Alternatively The phototool may comprise a hardcoat such as described in US 2013/059286 (Qiu) comprising (a) an epoxy silane compound, (b) a reactive silicone additive, and (c) photo-acid generator. The reactive silicone additive has one of the following general structures:

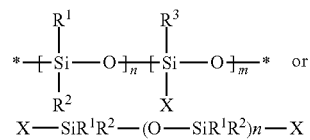

wherein:
R$^1$, R$^2$, and R$^3$ are independently a C$_1$-C$_6$ alkyl group or aromatic group with or without substitution;
X is a curable group selected from —OH, —OR, —OC(O)R, —OSiY$^1$Y$^2$Y$^3$, —CH$_2$CH$_2$-L-SiY$^1$Y$^2$Y$^3$ and R$_3$CO—, wherein R is a C$_1$-C$_4$ alkyl group, L is a divalent linkage group and Y$^1$, Y$^2$ and Y$^3$ are independently selected from C$_1$-C$_6$ alkyl groups and OR, and at least one Y is a curable group selected —OH, —OC(O)R and —OR, and n is at least 2 and m is at least 1 provided that the weight average molecular weight (M$_w$) of the reactive silicone additive is no more than about 4200.

Circuit Making

The photoresist coating composition may be combined with a diluent to a viscosity suitable for a selected method of coating and applied to a substrate by such a method as the spray coating, curtain coating, screen printing, or roll coating. The applied layer of the composition may be dried to evaporate the diluent contained in the composition and to obtain a coating film having reduced tack. The spray coating method and the curtain coating method can be advantageously used particularly among other methods of coating. Desirably the coated photocurable composition is exposed to heat to evaporate the solvent and partially cure the composition, in embodiments comprising a thermosetting component.

A photomask or phototool may be affixed to the coated photocurable composition, typically by vacuum lamination. The coated photocurable composition is selectively exposed to an actinic radiation, such as UV radiation, through a phototool having a prescribed pattern formed therein. Examples of light sources which are advantageously used for the purpose of photocuring the composition include low-pressure mercury lamp, medium-pressure mercury lamp, high-pressure mercury lamp, ultra-high-pressure mercury lamp, xenon lamp, and metal halide lamp, for example. The laser beam may be utilized as the actinic radiation for exposure of the coating film. Besides them, electron beam, alpha rays, beta rays, gamma rays, X-rays, and neutron rays are likewise usable.

After exposure, the phototool may be removed from the pattern-transferred coating comprising both cured and uncured photoresist without any damage for repeated use. With the photocurable compositions of this disclosure, the phototool may be cleanly and easily removed from the exposed photocurable composition layer, even from the hardest solder resists.

The selectively pattern-cured coating is developed with a suitable developer. For negative resist compositions the developer removes the unexposed regions. For positive resist composition the developer removes exposed regions. For solder masks, the developed coating may be subject to an additional heating and/or UV exposure step to fully cure the coating. If the photoresist composition further comprises a thermoset resin, the resist film is subsequently thermally cured by being heated to a temperature in the range of from 140 to 180° C., for example, to further crosslink the thermosetting component.

As a result, the photocurable composition excels in such properties as adhesiveness to the substrate, hardness, resistance to soldering temperature, resistance to chemicals, electrical insulating properties, and resistance to electrolytic corrosion which are expected of a resist, and which may be cleanly removed from a phototool after exposure, can be obtained.

EXAMPLES

Materials

Materials utilized are shown in Table 1.

TABLE 1

Materials List

| Material | Source | Description |
| --- | --- | --- |
| DMS-S12 | Gelest, Morrisville PA | Silanol terminated polydimethylsiloxane (PDMS), MW = 400~700, 16-32 cSt |
| DMS-S14 | Gelest, Morrisville PA | Silanol terminated PDMS, MW = 700-1500, 35-45 cSt |
| DMS-S15 | Gelest, Morrisville PA | Silanol terminated PDMS, MW = 2000-3500, 45-85 cSt |
| DMS-S21 | Gelest, Morrisville PA | Silanol terminated PDMS, MW = 4200, 90-120 cSt |
| DMS-XM11 | Gelest, Morrisville PA | Methoxy terminated PDMS, MW = 900-1000, 5-12 cSt |
| DMS-XT11 | Gelest, Morrisville PA | Triethoxysilylethyl terminated PDMS, MW = 900-1000, 5-12 cSt |
| BYK-307 | BYK, Wallingford, CT | Polyether modified PDMS |
| BYK-333 | BYK, Wallingford, CT | Polyether modified PDMS |
| Silwet L-7608 | Momentive, Columbus, OH | OH-terminated Trisiloxane, MW ~600 |
| CoatOsil 7600 | Momentive, Columbus, OH | MeO-terminated Pendant Silicone-PEO, MW~4,000 |
| CoatOsil 77 | Momentive, Columbus, OH | MeO-terminated Trisiloxane, MW ~600 |
| CoatOsil 3505 | Momentive, Columbus, OH | OH-terminated Linear Silicone-PPO. MW ~2,800 |
| CoatOsil 3500 | Momentive, Columbus, OH | OH-terminated Linear Silicone-PEO. MW ~2,100 |
| CoatOsil 7510 | Momentive, Columbus, OH | OH-terminated Pendant Silicone-PPO. MW ~13,000 |
| CoatOsil 7650 | Momentive, Columbus, OH | OH-terminated Pendant Silicone-PEO. MW ~3,000 |
| CoatOsil 3501 | Momentive, Columbus, OH | OH-terminated Pendant Silicone-PEO. MW ~8,000 |
| DC 5103 | Dow Corning, Midland, MI | OH-terminated Pendant Silicone-PEO (10.5) Surfactant, 35% siloxane content |
| Q2-5212 | Dow Corning, Midland, MI | OH-terminated Trisiloxane (13.2 unit of EO) |
| Q2-5211 | Dow Corning, Midland, MI | OH-terminated Trisiloxane Superwetting Agent, (11.5 unit of EO), 32% siloxane content |
| DC 1248 | Dow Corning, Midland, MI | OH-terminated Pendant Silicone-PPO (87/13) Fluid, MW ~6100, 87% siloxane content |
| Q4-3667 | Dow Corning, Midland, MI | OH-terminated Linear Silicone-PEO (45/55) Fluid, MW ~2,200, 45% siloxane content |
| FF-400 | Dow Corning, Midland, MI | AcO-terminated Pendant Silicone-PEO Fluid (6.6 unit of EO) |
| AUS 303 | Taiyo America, | Pre-measured mixture of PSR-4000 AUS 303/CA-40 |
| Solder Mask | Carson City, NV | AUS 303 supplied by Taiyo America |
| AUS 308 | Taiyo America, | Pre-measured mixture of PSR-4000 AUS 308/CA-40 |
| Solder Mask | Carson City, NV | AUS 308 supplied by Taiyo America |
| PET | duPont, Wilmington, DE | A transparent polyethylene terephthalate (PET) film obtained from under the trade designation "Melinex 618" having a thickness of 5.0 mils and a primed surface. |
| FX-1000 | 3M, St. Paul, MN | Scotchgard Film Protector |
| FX-2000 | 3M, St. Paul, MN | Scotchgard Film Protector |

Test Methods

Release

A 2.54 cm wide strip of Scotch 610 cellophane tape (3M Company, St. Paul, Minn.) was laminated to the sample coatings with two passes of a 2 kg rubber roller. An Imas SP2000 (IMASS Inc., Accord, Mass.) was utilized to peel the tape at an angle of 180 degrees and a speed of 2.3 m/min for 5 seconds. Peel force was measured. Tests were performed at 21° C. and 50% RH. Typically, 3 measurements were made from different locations and the mean reported Re-Adhesion The tape strips utilized in the Release test were peeled and laminated to a clean stainless steel panel with two passes of a 2 kg rubber roller. An Imass SP2000 was used to peel the tape at an angle of 180 degrees and a speed of 30 cm/min for 10 seconds. Peel force was measured. Tests were performed at 21° C. and 50% RH. Typically, 3 measurements were made from different locations and the mean reported.

Contact Angle

Advancing, receding, and static contact angles were measured with a Krus DSA100 (Cruss GmbH, Hamburg, Germany). Measurements were made using reagent-grade hexadecane and deionized water, on a video contact angle system analyzer (VCA-2500XE, AST Products, Billerica, Mass.). Reported values are the averages of measurements on at least three drops measured on the right and the left sides of the drops. Drop volumes were 5 microliters for static contact angle measurements and 1-3 microliters for advancing and receding contact angle measurements.

Control

AUS 303 Solder Mask (Control-1)

An ink composition was prepared according to "Taiyo PSR-4000 AUS303" Technical Data Sheet, copyright 2005. Briefly, PSR-4000 AUS 303 was supplied in a pre-measured container with a mix ratio by weight of 70 parts PSR-4000 AUS 303 and 30 parts CA-40 AUS 303. This mixture was mixed by hand with a spatula for 10-15 minutes, and coated on primed PET with a #30 wire rod. The coated PET was dried at 80° C. for 20 minutes, and then placed on a conveyer belt coupled to a ultraviolet ("UV") light curing device and UV cured under nitrogen using a Fusion 500 watt H bulb at 30 ft/min.

AUS 308 Solder Mask (Control-2)

Control-2 was prepared in a similar fashion utilizing PSR-4000 AUS 308 and CA-40 AUS 308.

Example 1 (E-1)

DMS-S21 (additive) was mixed into the AUS 303 Solder Mask at 1% (w/w) by hand with a spatula for 10 minutes, and coated on primed PET with a #30 wire rod. The coated PET was dried at 80 C for 20 minutes, and irradiated with an H-bulb UV under nitrogen.

E-2 through E-22

Additional examples were prepared as in E-1 with the additives and concentrations shown in Table 2.

Comparative 1 (C-1 Through C-5)

C-1 through C-5 were prepared as in E-1, with the additives shown in Table 3.

Results

Example formulations and results are shown in Table 2. Comparative formulations and results are shown in Table 3. Example formulations were tested on two different solder masks.

TABLE 2

Silicone-PEG Additives

| Sample | Additive (wt %) | Release (g/inch) | Re-adhesion (g/inch) |
|---|---|---|---|
| AUS 303 Solder Mask | | | |
| Control 1 | None | 712 | 422 |
| E-1 | DC 1248 (1%) | 4 | 314 |
| E-2 | CoatOsil-7510 (1%) | 7 | 334 |
| E-3 | CoatOsil-7650 (1%) | 20 | 391 |
| E-4 | CoatOsil 3500 (1%) | 64 | 420 |
| E-5 | CoatOsil-3501 (1%) | 16 | 448 |
| E-6 | CoatOsil-3505 (1%) | 18 | 369 |
| E-7 | BYK-307 (1%) | 18 | 484 |
| E-8 | BYK-333 (1%) | 45 | 468 |
| E-9 | CoatOsil 3500 (1%) | 64 | 420 |
| E-10 | Q4-3667 (1%) | 53 | 476 |
| E-11 | FF-400 (1%) | 27 | 414 |
| AUS 308 Solder Mask | | | |
| Control 2 | None | 789 | 314 |
| E-12 | CoatOsil 7510 (1%) | 8 | 287 |
| E-13 | CoatOsil 7510 (0.5%) | 7 | 282 |
| E-14 | CoatOsil 7650 (1%) | 30 | 370 |
| E-15 | CoatOsil l 3501 (1%) | 22 | 519 |
| E-16 | CoatOsil 3505 (1%) | 8 | 288 |
| E-17 | BYK-307 (1%) | 27 | 459 |
| E-18 | DC 1248 (1%) | 6 | 354 |
| E-19 | DC 1248 (0.5%) | 74 | 387 |
| E-20 | DC 1248 (0.25%) | 130 | 331 |
| E-21 | DC 1248 (0.1%) | 196 | 368 |

TABLE 3

Comparatives (AUS 303 Solder Mask)

| Sample | Additive (all at 1% w/w) | Release g/inch | Re-adhesion g/inch |
|---|---|---|---|
| Non-PEG silicone additives | | | |
| Control-1 | None | 714 | 409 |
| C-1 | DMS-S21 | 393 | 274 |
| C-2 | DMS-S15 | 320 | 247 |
| C-3 | DMS-XM11 | 266 | 280 |
| C-4 | DMS-XT11 | 251 | 270 |
| Silicone-PEG additive containing ≤35% siloxane bock | | | |
| C-5 | Q2-5211 | [a] | [a] |
| C-6 | Q2-5212 | 640 | 361 |
| C-7 | Silwet L-7608 | 725 | 368 |
| C-8 | CoatOsil 77 | 657 | 344 |
| C-9 | CoatOsil 7600 | 611 | 364 |
| C-10 | DC 5103 | 129 | 385 |

[a] tape stripped the coating off the PET film

An Example a solder mask was prepared by mixing 21 g PSR-4000 AUS308, 9 g CA-40 AUS308, and 10 g diglyme. To this was added 0.5 wt. % BYK-333 with additional mixing. This formulation was coated on primed PET with a #12 wire rod and cured as in E-1. Water contact angles were measured and are shown in Table 4.

TABLE 4

Contact Angles for BYK-333 Modified Solder Mask

| Sample | BYK-333 wt % | Advancing degrees | | Receding degrees | | Static degrees | |
|---|---|---|---|---|---|---|---|
| | | Left | Right | Left | Right | Left | Right |
| C-11 | None | 70 | 70 | 25 | 24 | 63 | 62 |
| E-22 | 0.5% | 102 | 102 | 62 | 62 | 95 | 95 |
| E-23 | 1% | 106 | 106 | 67 | 66 | 97 | 96 |

Table 4 demonstrates the addition of a silicone-PEG additive reduces the surface energy of the solder mask coating.

The durability of several representative Example coatings was evaluated by performing the Release test with three fresh pieces of 610 tape on the same location of the coated PET film. As shown in Table 5, the release values increase, but the release of the third tape strip remains well below that of the control.

TABLE 5

Coating Durability

| Sample | Additive (wt %) | Durability (g/in) | |
|---|---|---|---|
| | | Release g/inch | Re-adhesion g/inch |
| AUS 303 Solder Mask | | | |
| Control-1 | None | 724 | 419 |
| | | 671 | 444 |
| | | 752 | 430 |
| E-1 | DOW 1248 (1%) | 5 | 321 |
| | | 13 | 334 |
| | | 31 | 316 |
| E-2 | CoatOsil 7510 (1%) | 7 | 320 |
| | | 9 | 341 |
| | | 12 | 345 |
| AUS 308 Solder Mask | | | |
| Control-2 | None | 794 | 312 |

TABLE 5-continued

Coating Durability

| Sample | Additive (wt %) | Durability (g/in) | |
|---|---|---|---|
| | | Release g/inch | Re-adhesion g/inch |
| | | 815 | 393 |
| | | 897 | 414 |
| E-13 | CoatOsil 7510 (0.5%) | 8 | 289 |
| | | 8 | 332 |
| | | 11 | 349 |
| E-15 | CoatOsil 3501 (1%) | 8 | 525 |
| | | 21 | 509 |
| | | 80 | 515 |
| E-18 | DOW 1248 (1%) | 6 | 309 |
| | | 22 | 303 |
| | | 41 | 342 |

Release from Solder Masks

An Example formulation was prepared by mixing 28 g PSR-4000 AUS308, 12 g CA-40 AUS308, and 0.5 wt % BYK-333 as in E-1. A control containing no BYK and the BYK formulation were coated on primed PET and dried as in E-1. Once cooled, different PET films were laminated to the control and Example films with two passes of a 2 kg rubber and cured with UV (H-bulb) as in E-1. The laminates are shown in Table 6.

TABLE 6

Solder Mask Laminates

| Sample | Sample Film | Laminated Film Coating |
|---|---|---|
| A | Control | None |
| B | Control | FX-1000 |
| C | Control | FX-2000 |
| D | 0.5% BYK-333 | None |
| E | 0.5% BYK-333 | FX-1000 |
| F | 0.5% BYK-333 | FX-2000 |

The ease of removal (laminated PET film from control and Example films) was determined. The order was found to be (easiest removal listed first): F>D>C>E>A>B. In summary, the release of the FX-2000 coated PET from the solder mask containing 0.5% BYK was the easiest.

What is claimed is:

1. A photocurable composition comprising:
a) a solder photoresist component, and
b) a silicone-polyether block copolymer, wherein the silicone block comprises ≥35 wt. % of said copolymer, and wherein said silicone-polyether block copolymer is a linear or pendent copolymer of the formulas $A^{SIL}_a\text{-}B^{PE}_b$, or $B^{PE}_b\text{-}A^{SIL}_a\text{-}B^{PE}_b$, wherein $A^{SIL}$ represents a silicone block, $B^{PE}$ represents a polyether block, a and b are weight percents of each block, the silicone-polyether block copolymer being present in amount of 0.1 to 5 parts by weight relative to 100 parts by weight of the photoresist component;
c) a photoinitiator; and
d) further comprising a thermoset resin in an amount from 5 to 40 parts by weight, based on 100 parts by weight of the photoresist component.

2. The photocurable composition of claim 1, wherein the average molecular weight, $M_w$, of the silicone-polyether block copolymer is from 200 to 15,000.

3. The photocurable composition of claim 1, wherein said silicone-polyether block copolymer is of the formula:

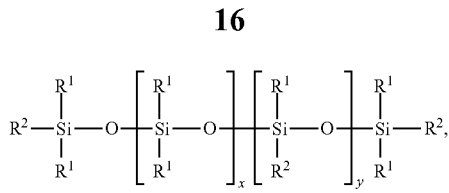

wherein
each $R^1$ is independently selected from alkyl and aryl,
each $R^2$ is independently selected from alkyl, aryl and polyether block,
x is 3 to 100,
y is 0 to 20, with the proviso that at least one $R^2$ group is a polyether block.

4. The photocurable composition of claim 3 wherein the $R^2$ blocks are linear or branched $C_2$-$C_4$ polyether groups.

5. The photocurable composition of claim 1, wherein said silicone-polyether block copolymer is of the formula:

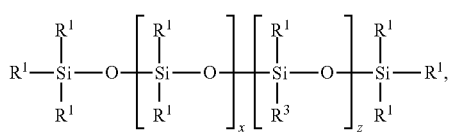

wherein
each $R^1$ is independently selected from alkyl and aryl,
each $R^3$ is a polyether block,
x is 3 to 100,
z is 1 to 20.

6. The photocurable composition of claim 1, wherein said silicone-polyether block copolymer is of the $(A^{SIL})_a$-$(B^{PE})_b$ block formula:

$$R^1-\underset{\underset{R^1}{|}}{\overset{\overset{R^1}{|}}{Si}}-O-\left[\underset{\underset{R^1}{|}}{\overset{\overset{R^1}{|}}{Si}}-O\right]_x-\underset{\underset{R^1}{|}}{\overset{\overset{R^1}{|}}{Si}}-R^3,$$

wherein
each $R^1$ is independently selected from alkyl and aryl,
each $R^3$ is a polyether block,
x is 3 to 100.

7. The photocurable composition of claim 1, wherein the polyether block is of formula:

$$-Q-(C_nH_{2n}O)_w-R^5,$$

wherein
n is 2 to 4,
w is 2 to 50,
$R^5$ is H, alkyl, or aryl, and
Q is a divalent linking group selected from —O—, —$NR^6$—, —$C_mH_{2m}O$—, and —$C_mCH_{2m}(OH)$ $C_2H_4X$—, where $R^6$ is H, alkyl, or aryl, and each m is independently 1 to 4,
and X is —O—, —S— or —$NR^6$.

8. A multilayer article comprising
a) a metallic base substrate,
b) a phototool,
c) the photocurable layer of claim 1 disposed therebetween.

9. The multilayer article of claim 8, wherein the photocurable layer has been partially cured by heat and/or light exposure.

10. The multilayer article of claim 8 further comprising a hardcoat disposed on the surface of the phototool.

11. The photocurable composition of claim 1 having a release value less than 100 g/in (~39 g/cm).

* * * * *